(12) United States Patent
Cheng et al.

(10) Patent No.: US 9,799,750 B2
(45) Date of Patent: Oct. 24, 2017

(54) SEMICONDUCTOR DEVICE AND FABRICATION METHOD THEREOF

(75) Inventors: Chun-Fai Cheng, Hong Kong (HK); Han-Ting Tsai, Kaoshiung (TW); An-Shen Chang, Jubei (TW); Hui-Min Lin, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/551,107

(22) Filed: Jul. 17, 2012

(65) Prior Publication Data

US 2014/0021517 A1 Jan. 23, 2014

(51) Int. Cl.
*H01L 29/772* (2006.01)
*H01L 29/66* (2006.01)
*H01L 21/8238* (2006.01)
*H01L 29/78* (2006.01)

(52) U.S. Cl.
CPC .......... *H01L 29/66636* (2013.01); *H01L 21/823807* (2013.01); *H01L 21/823814* (2013.01); *H01L 21/823864* (2013.01); *H01L 29/6656* (2013.01); *H01L 29/7848* (2013.01); *H01L 29/66628* (2013.01)

(58) Field of Classification Search
CPC .................................................... H01L 29/772
USPC ........... 257/288, E29.242, E21.409; 438/294
See application file for complete search history.

(56) References Cited

U.S. PATENT DOCUMENTS

| | | | |
|---|---|---|---|
| 6,406,987 B1 * | 6/2002 | Huang | 438/595 |
| 6,627,504 B1 * | 9/2003 | Bertrand et al. | 438/303 |
| 8,350,253 B1 * | 1/2013 | Zhu | H01L 21/823807 257/19 |
| 2005/0035397 A1 * | 2/2005 | Otoi et al. | 257/316 |
| 2005/0142768 A1 * | 6/2005 | Lindert et al. | 438/285 |
| 2006/0138398 A1 * | 6/2006 | Shimamune | H01L 21/02381 257/19 |
| 2007/0020864 A1 * | 1/2007 | Chong et al. | 438/300 |
| 2007/0196972 A1 * | 8/2007 | Shima | 438/197 |
| 2008/0258227 A1 * | 10/2008 | Wang et al. | 257/369 |
| 2009/0095992 A1 * | 4/2009 | Sanuki et al. | 257/288 |
| 2010/0102400 A1 * | 4/2010 | Sell | 257/411 |
| 2010/0219474 A1 * | 9/2010 | Kronholz et al. | 257/347 |
| 2011/0241085 A1 * | 10/2011 | O'Meara | H01L 29/4983 257/288 |

* cited by examiner

*Primary Examiner* — Olik Chaudhuri
*Assistant Examiner* — Lamont Koo
(74) *Attorney, Agent, or Firm* — Slater Matsil, LLP

(57) ABSTRACT

A semiconductor device and a method for fabricating the semiconductor device are disclosed. An isolation structure is formed in a substrate and a gate stack is formed atop the isolation structure. A spacer is formed adjoining a sidewall of the gate stack and extends beyond an edge of the isolation structure. The disclosed method provides an improved method for protecting the isolation structure by using the spacer. The spacer can prevent the isolation structure from being damaged by chemicals, therefor, to enhance contact landing and upgrade the device performance.

21 Claims, 8 Drawing Sheets

SEMICONDUCTOR DEVICE AND FABRICATION METHOD THEREOF

FIELD

The disclosure relates to integrated circuit fabrication and, more particularly, to a semiconductor device with a strained structure.

BACKGROUND

When a semiconductor device, such as a metal-oxide-semiconductor field-effect transistor (MOSFET), is scaled down through various technology nodes, high-k gate dielectric layers and metal gate electrode layers are incorporated into the gate stack of the MOSFET to improve device performance with the decreased feature sizes. In addition, strained structures in source and drain (S/D) recess cavities of the MOSFET utilizing stress layers, such as selectively grown silicon germanium (SiGe), may be used to enhance carrier mobility.

However, there are challenges to implement such features and processes in complementary metal-oxide-semiconductor (CMOS) fabrication. As the gate length and spacing between devices decrease, these problems are exacerbated. For example, it is difficult to achieve enhanced carrier mobility for a semiconductor device, because strained materials cannot deliver a given amount of strain into the channel region of the semiconductor device, thereby increasing the likelihood of device instability and/or device failure.

BRIEF DESCRIPTION OF THE DRAWINGS

The present disclosure is better understood from the following detailed description when read with the accompanying figures. It is emphasized that various features may not be drawn to scale and are used for illustrative purposes only. Additionally, the relative dimensions of the various features may be arbitrarily increased or reduced for clarity of discussion.

DESCRIPTION

Figure 1:
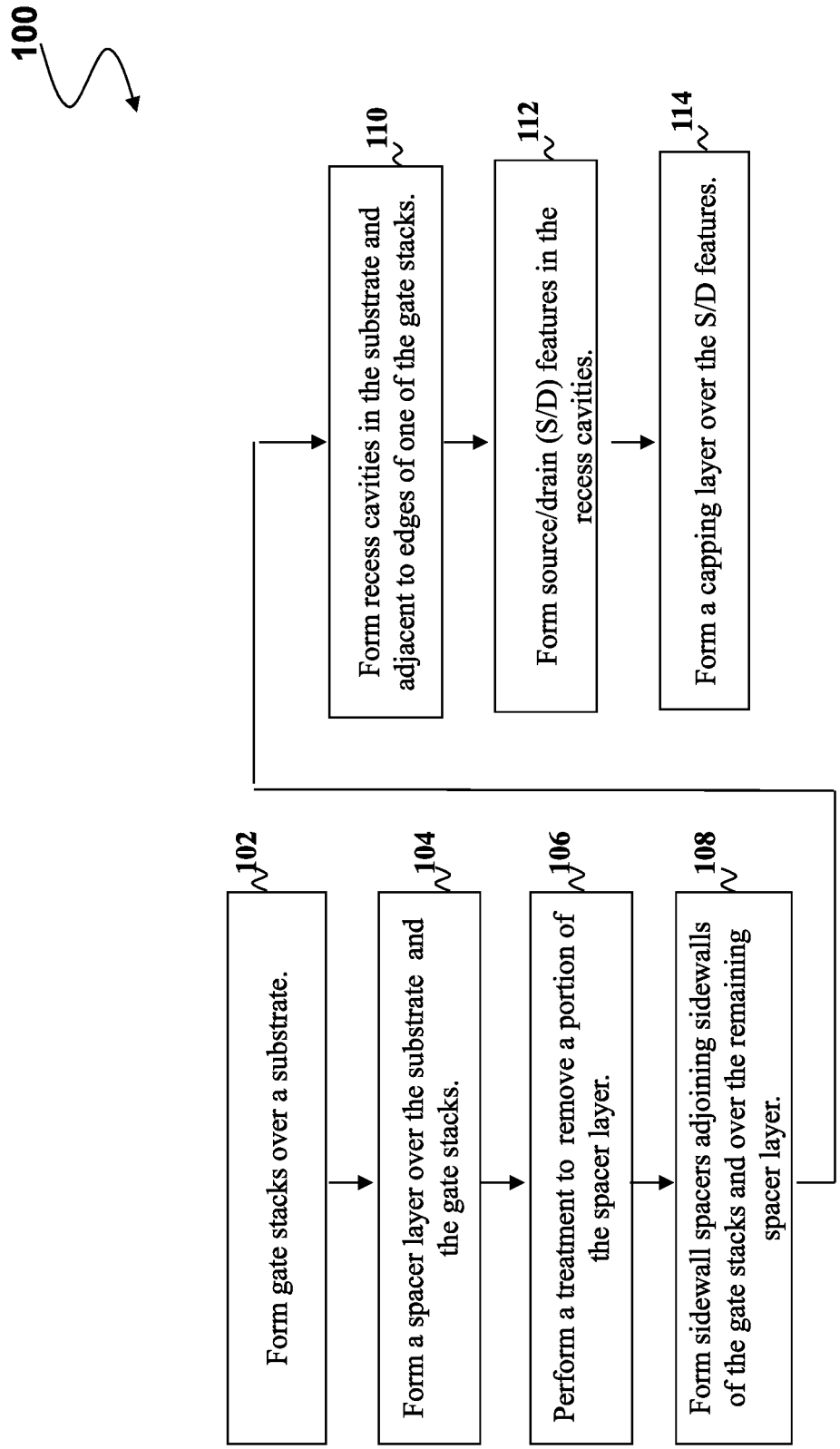
FIG. 1 is a flowchart illustrating a method for fabricating a semiconductor device comprising a strained structure according to various aspects of the present disclosure.

It is understood that the following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 is a flowchart illustrating a method 100 for fabricating a semiconductor device 200 according to various aspects of the present disclosure. FIGS. 2-8 show schematic cross-sectional views of a semiconductor device 200 at various stages of fabrication according to an embodiment of the method 100 of FIG. 1. The semiconductor device 200 may be included in a microprocessor, memory cell, and/or other integrated circuit (IC). It is noted that the method of FIG. 1 does not produce a completed semiconductor device 200. A completed semiconductor device 200 may be fabricated using complementary metal-oxide-semiconductor (CMOS) technology processing. Accordingly, it is understood that additional processes may be provided before, during, and after the method 100 of FIG. 1, and that some other processes may only be briefly described herein. Also, FIGS. 1 through 8 are simplified for a better understanding of the present disclosure. For example, although the figures illustrate the semiconductor device 200, it is understood the IC may comprise a number of other devices comprising resistors, capacitors, inductors, fuses, etc.

Figure 2:
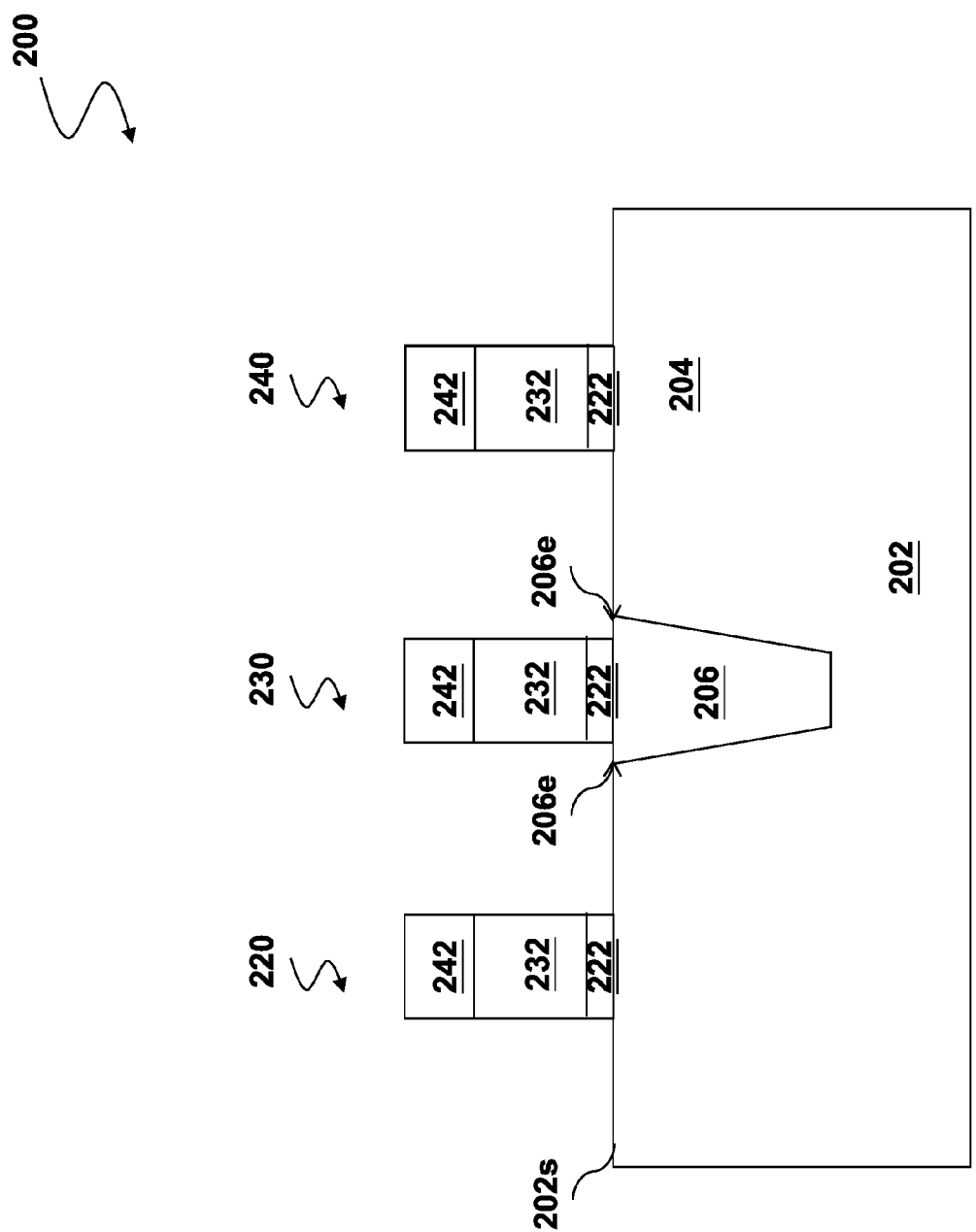
FIGS. 2-8 show schematic cross-sectional views of a strained structure of a semiconductor device at various stages of fabrication according to various aspects of the present disclosure.

Referring to FIGS. 1 and 2, the method 100 begins at step 102 wherein gate stacks 220, 230, and 240 are formed over a substrate 202, wherein the gate stack 230 is positioned horizontally between the gate stacks 220 and 240. The substrate 202 includes a top surface 202s. In one embodiment, the substrate 202 comprises a crystalline silicon substrate (e.g., Si wafer). In the present embodiment, the substrate 202 is referred to as a (100) substrate having the top surface 202s formed of the (100) crystal plane. In an alternative embodiment, the substrate 202 may include a silicon-on-insulator (SOI) structure.

In some embodiments, the substrate 202 further comprises active regions 204. The active regions 204 may include various doping configurations depending on design requirements. In some embodiments, the active regions 204 may be doped with p-type or n-type dopants. For example, the active regions 204 may be doped with p-type dopants, using a chemical such as boron or $BF_2$ to perform the doping; n-type dopants, using a chemical such as phosphorus or arsenic to perform the doping; and/or combinations thereof. The active regions 204 may act as regions configured for an N-channel metal-oxide-semiconductor transistor device (referred to as an NMOS transistor) and regions configured for a P-channel metal-oxide-semiconductor transistor device (referred to as a PMOS transistor).

Still referring to FIG. 2, an isolation structure 206 is formed in the substrate 202 and under the gate stack 230 to isolate the various active regions 204. The isolation structure 206 has edges 206e intersecting with the top surface 202s of the substrate 202. The isolation structure 206, for example, is formed using isolation technology, such as local oxidation of silicon (LOCOS) or shallow trench isolation (STI), to define and electrically isolate the various active regions 204. In the present embodiment, the isolation structure 206 includes a STI. The isolation structure 206 may comprise silicon oxide, silicon nitride, silicon oxynitride, fluoride-doped silicate glass (FSG), a low-K dielectric material, other suitable materials, and/or combinations thereof. The isolation structure 206, and in the present embodiment, the STI, may be formed by any suitable process. As one example, the formation of the STI may include patterning the semiconductor substrate 202 by a photolithography process, etching a trench in the substrate 202 (for example, by using a dry etching, wet etching, and/or plasma etching process), and filling the trench (for example, by using a chemical vapor deposition process) with a dielectric material. In some embodiments, the filled trench may have a multi-layer structure such as a thermal oxide liner layer filled with silicon nitride or silicon oxide.

Still referring to FIG. 2, in some embodiments, the gate stacks 220, 230, and 240 are formed by sequentially depositing and patterning a gate dielectric layer 222, a gate electrode layer 232, and a hard mask layer 242 on the substrate 202. The gate dielectric layer 222, in one example, is a thin film comprising silicon oxide, silicon nitride, silicon oxynitride, high-k dielectrics, other suitable dielectric materials, or combinations thereof. High-k dielectrics comprise metal oxides. Examples of metal oxides used for high-k dielectrics include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu and mixtures thereof. In the present embodiment, the gate dielectric layer 222 is a high-k dielectric layer with a thickness in the range of about 10 angstroms to about 30 angstroms. The gate dielectric layer 222 may be formed using a suitable process such as atomic layer deposition (ALD), chemical vapor deposition (CVD), physical vapor deposition (PVD), thermal oxidation, UV-ozone oxidation, or combinations thereof. The gate dielectric layer 222 may further comprise an interfacial layer (not shown) to reduce damage between the gate dielectric layer 222 and substrate 202. The interfacial layer may comprise silicon oxide.

The gate electrode layer 232 is then formed on the gate dielectric layer 222. In some embodiments, the gate electrode layer 232 comprises a single layer or a multilayer structure. In the present embodiment, the gate electrode layer 232 comprises polysilicon. Further, the gate electrode layer 232 may be doped polysilicon with the same or different doping species. In one embodiment, the gate electrode layer 214 has a thickness in the range of about 30 nm to about 60 nm. The gate electrode layer 232 may be formed using a process such as low-pressure chemical vapor deposition (LPCVD), plasma enhanced chemical vapor deposition (PECVD), other suitable processes, or combinations thereof.

Next, the hard mask layer 242 is formed over the gate electrode layer 232 and a patterned photo-sensitive layer (not shown) is formed on the hard mask layer 242. The pattern of the photo-sensitive layer is transferred to the hard mask layer 242 and then transferred to the gate electrode layer 232 and gate dielectric layer 222 to form the gate stacks 220, 230, and 240 over the top surface 202s of the substrate 202 as illustrated in FIG. 2. In some embodiments, the hard mask layer 242 comprises silicon oxide. In alternative embodiments, the hard mask layer 242 comprises silicon nitride, silicon oxynitride, and/or other suitable dielectric materials, and may be formed using a method such as CVD or PVD. The hard mask layer 242 has a thickness in the range from about 100 angstroms to about 800 angstroms. The photo-sensitive layer is removed thereafter by a dry and/or wet stripping process.

Figure 3:
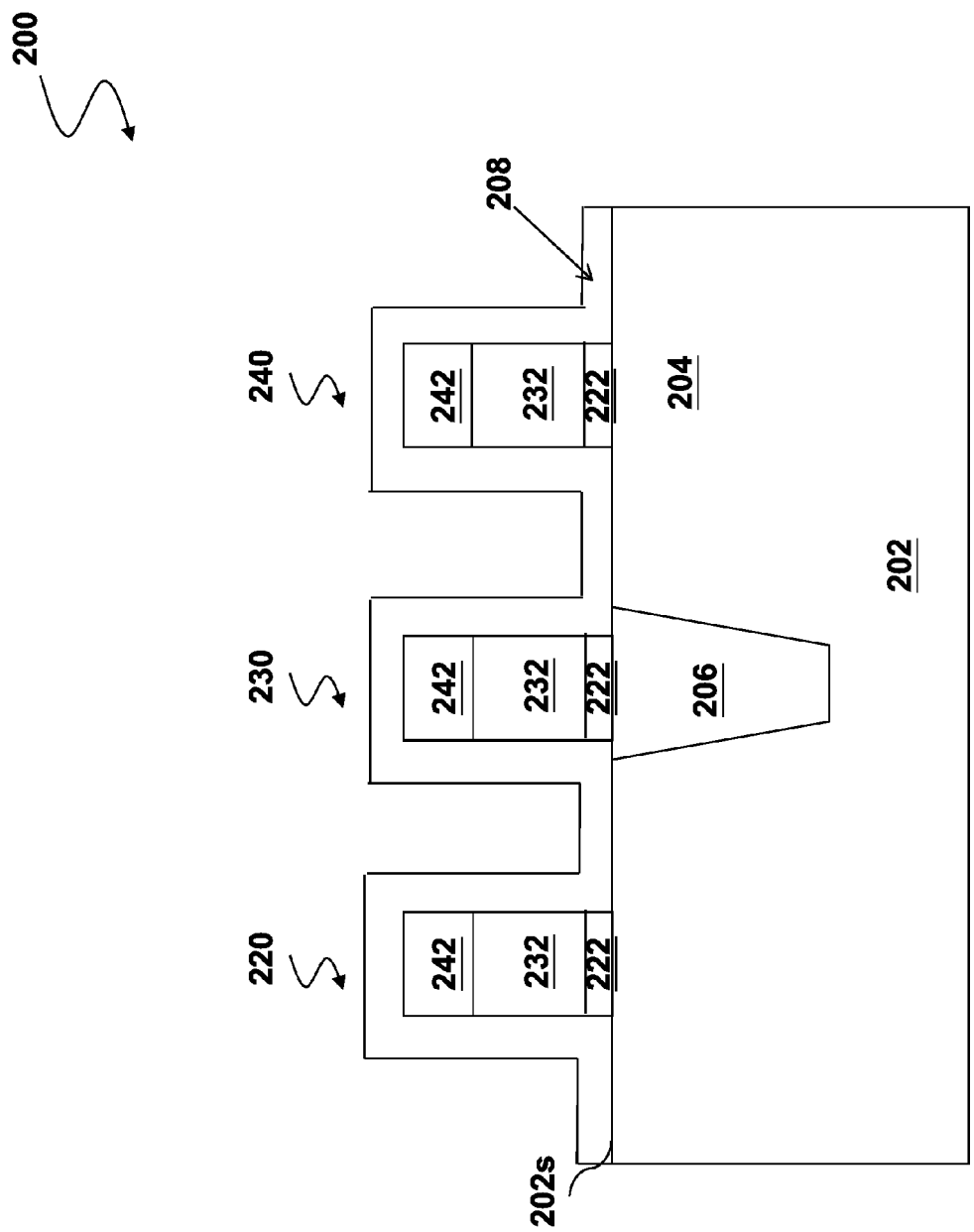

Referring to FIGS. 1 and 3, the method 100 proceeds to step 104 wherein a spacer layer 208 is formed over the substrate 202 and the gate stacks 220, 230, and 240. In some embodiments, the spacer layer 208 is a single-layer structure. In alternative embodiments, the spacer layer 208 includes a multi-layer structure. In some embodiments, the spacer layer 208 is silicon nitride or SiCN. In alternative embodiments, the spacer layer 208 includes silicon oxynitride, other suitable material, or combinations thereof. In the present embodiment, the spacer layer 208 is formed by a deposition process including CVD, PVD, ALD, or other suitable techniques. In some embodiments, the spacer layer 208 has a thickness ranging from about 70 angstroms to about 120 angstroms.

Figure 4:
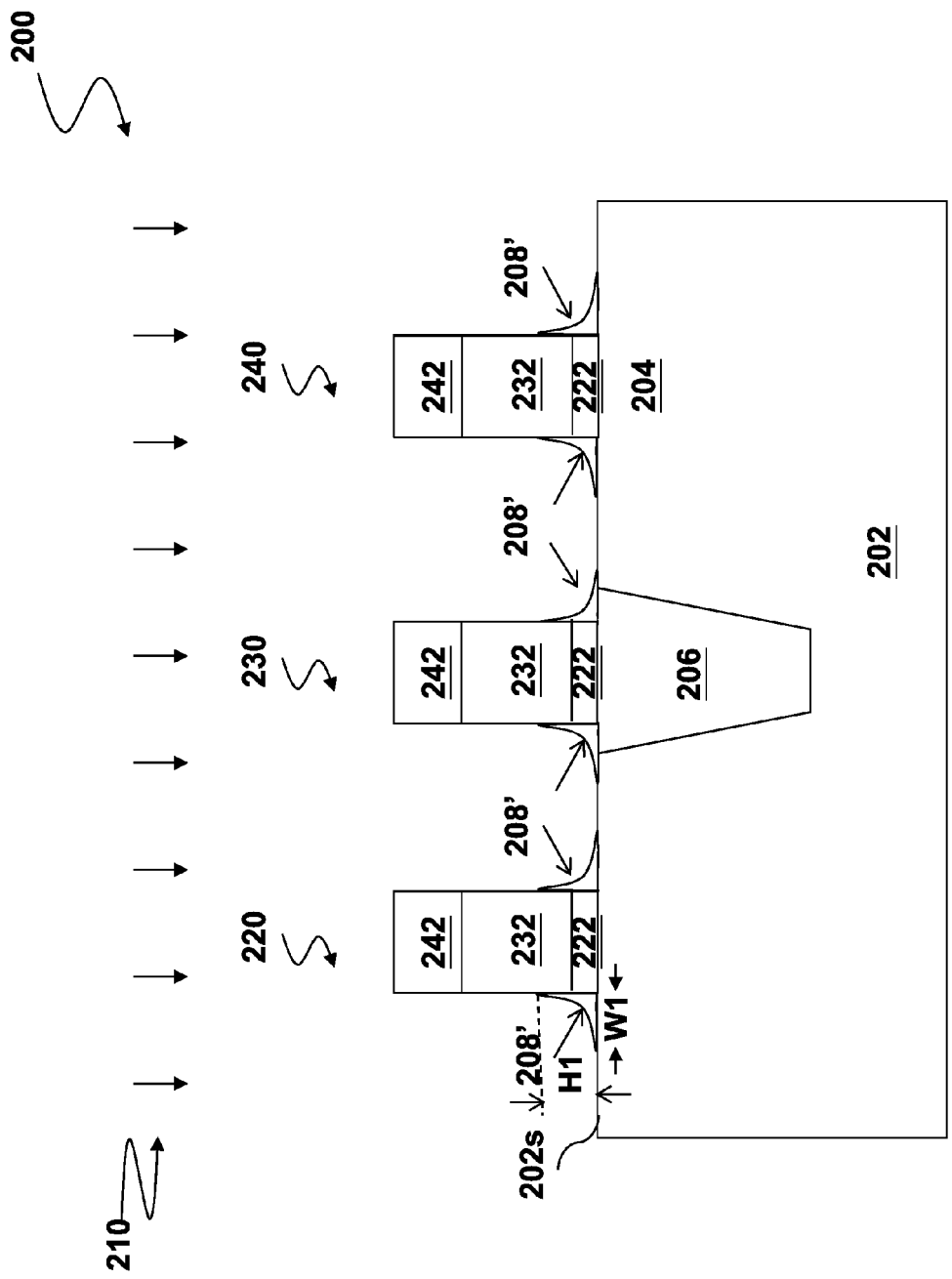

Referring to FIGS. 1 and 4, the method 100 proceeds to step 106 wherein a treatment 210 is performed on the spacer layer 208 to remove at least a portion of the spacer layer 208. In some embodiments, the treatment 210 removes a portion of the spacer layer 208 while leaving other portions of the spacer layer 208 to form spacer footings 208'. In some embodiments, the spacer footings 208' adjoin opposite sidewalls of the gate stacks 220, 230, and 240. In some embodiments, the spacer footings 208' have a first side with a height H1 along lower portion of the sidewalls of the gate stacks 220, 230, and 240, a second side with a width W1 over the top surface 202s of the substrate 202, and an exterior surface connecting the first side and the second side. In some embodiments, the exterior surface has a concave shape. In some embodiments, the height H1 is less than a height of the gate stacks 220, 230, or 240 to allow a good gap filling between gate stacks 220, 230, or 240 in the subsequent process. In alternative embodiments, the height H1 ranges from about 3 nm to about 10 nm. In some embodiments, the width W1 is greater than about 5 nm such that the spacer footings 208' extend beyond the edges 206e of the isolation structure 206, thereby the spacer footings 208' can protect the edges 206e of the isolation structure 206 from being damaged by chemicals, e.g., HF, used in the subsequent process. In alternative embodiments, the width W1 ranges from about 5 nm to about 10 nm.

In some embodiments, the treatment 210 includes dry etching process, wet etching process, and/or plasma treatment. In the present embodiment, the treatment 210 is an anisotropic etching process performed using etching gas including $CF_4$, $CHF_3$, $SF_6$ or combinations thereof, with a mass flow rate of about 50 sccm to about 200 sccm, under a pressure of about 3 mTorr to about 20 mTorr, and lasting for a period of time of about 20 seconds to about 200 seconds. In some embodiments, the treatment 210 is a dry etching process with an etching bias of about 0 volt to about 20 volts.

Figure 5:
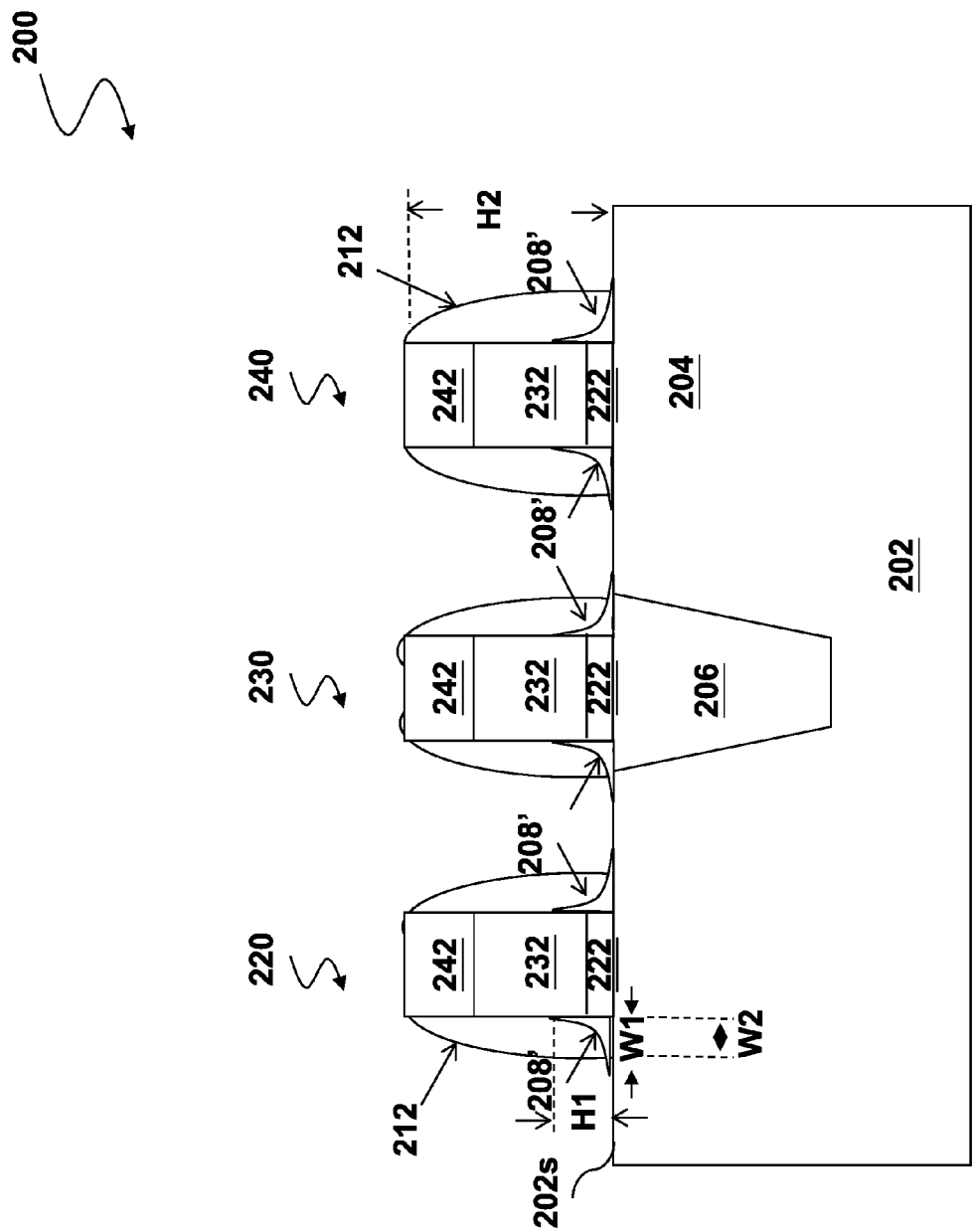

Referring to FIGS. 1 and 5, the method 100 continues with step 108 in which sidewall spacers (or referred to gate spacers) 212 are formed over the exterior surface of the spacer footings 208' and adjoining upper portion of the sidewalls of the gate stacks 220, 230, and 240. The sidewall spacers 212 have a height H2 and a width W2 as illustrating in FIG. 5. In some embodiments, the height H2 is greater than the height H1 of the spacer footings 208', thereby protecting other portion of sidewalls of the gate stacks 220, 230, and 240 and maintaining a good gap filling between the gate stacks 220, 230, or 240 in the subsequent processes. In some embodiments, the width W2 is less than the width W1 of the spacer footings 208'. In alternative embodiments, the width W2 is less than the width W1 of the spacer footings 208'. In some embodiments, the sidewall spacers 212 may include a single layer or a multi-layer structure. In the present embodiment, a blanket layer of spacer material (not shown) is formed over the spacer footings 208' and the gate stacks 220, 230, and 240 by a deposition process such as CVD, PVD, ALD, or other suitable techniques. In some embodiments, the spacer material includes a material different from the spacer footings 208' such that there is a high etch selectivity between the spacer material and the spacer footings 208' during a subsequent etching process for forming the sidewall spacers 212. In alternative embodiments, the spacer material includes a material same as to the spacer footings 208'. In some embodiments, the spacer material comprises silicon oxide, silicon nitride, silicon oxynitride, other suitable material, or combinations thereof. In some embodiments, the spacer material has a thickness ranging from about 5 nm to about 15 nm. An etch process, such as an anisotropic etch, may be performed on the spacer material to form the sidewall spacers 212 as illustrated in FIG. 5.

Figure 6:
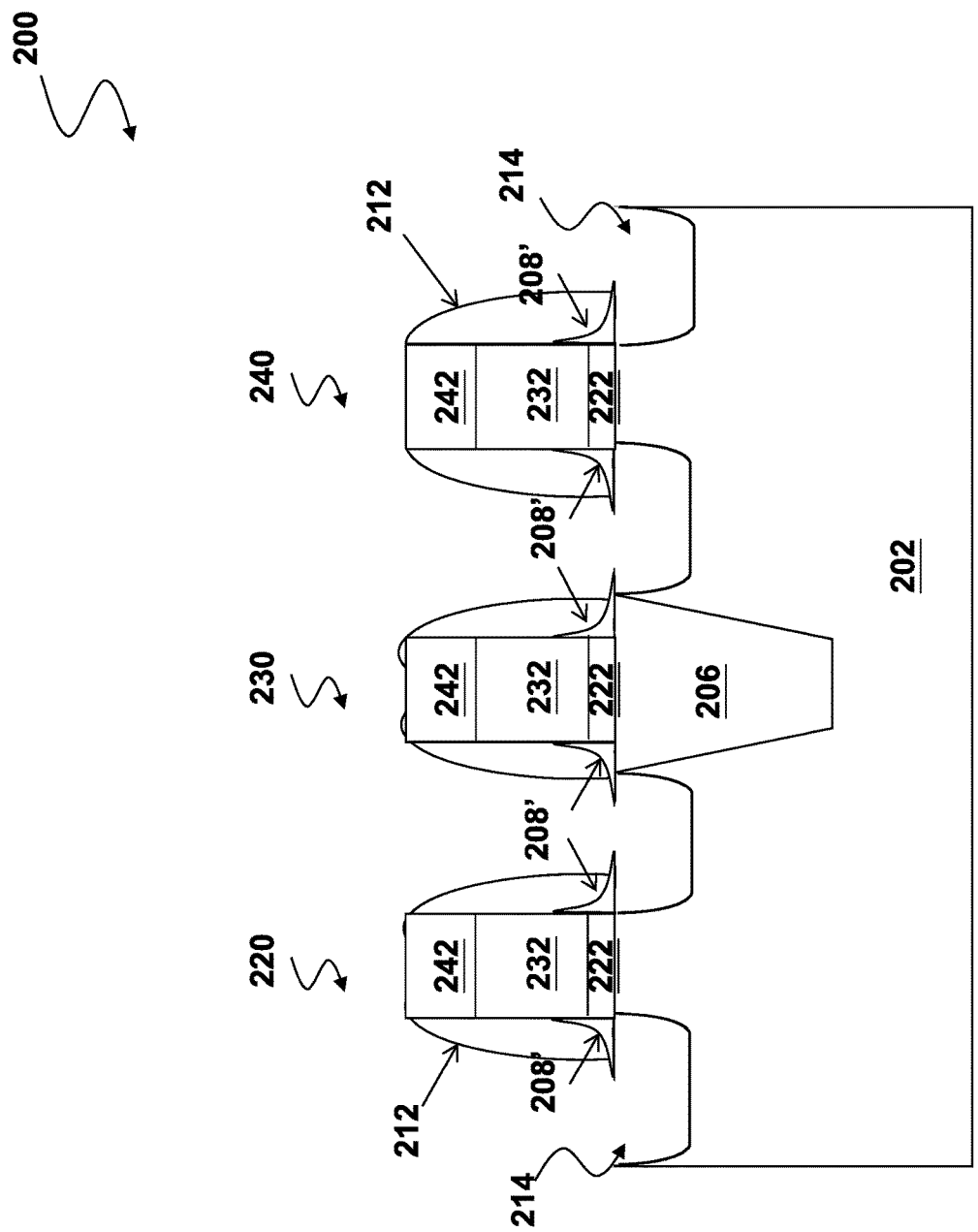

Referring to FIGS. 1 and 6, the method 100 continues with step 110 in which recess cavities 214 are formed in the substrate 202 adjacent to opposite edges of the gate stacks 220, 230, and 240. In some embodiments, the recess cavities 214 are source and drain (S/D) recess cavities for the gate stacks 220, 230, and 240. In the present embodiment, the processes for forming the recess cavities 214 are started using an isotropic dry etching process, followed by an anisotropic wet or dry etching process. In some embodiments, the isotropic dry etching process is performed using the sidewall spacers 212 and/or the spacer footings 208' as hard masks to recess the substrate 202. The surface 202s of the substrate 202 unprotected by the sidewall spacers 212 and/or the spacer footings 208' are recessed to form initial recess cavities (not shown) in the substrate 202. In an embodiment, the isotropic dry etching process may be performed under a pressure of about 1 mTorr to about 1000 mTorr, a power of about 50 W to about 1000 W, a bias voltage of about 20 V to about 500 V, at a temperature of about 40° C. to about 60° C., using HBr and/or $Cl_2$ as etch gases. Also, in the embodiments provided, the bias voltage used in the isotropic dry etching process may be tuned to allow better control of an etching direction to achieve desired profiles for the S/D recess regions.

In some embodiments, a wet etching process is then provided to enlarge the initial recess cavities to form the recess cavities 214. In some embodiments, the wet etching process is performed using a chemical comprising hydration tetramethyl ammonium (TMAH), or the like. In some embodiments, the recess cavities 214 are wedge-shaped with tips (not shown) extend into the substrate 202 in the region underneath the sidewall spacers 212 toward the channel region under the gate stacks 220, 230, and 240.

Figure 7:
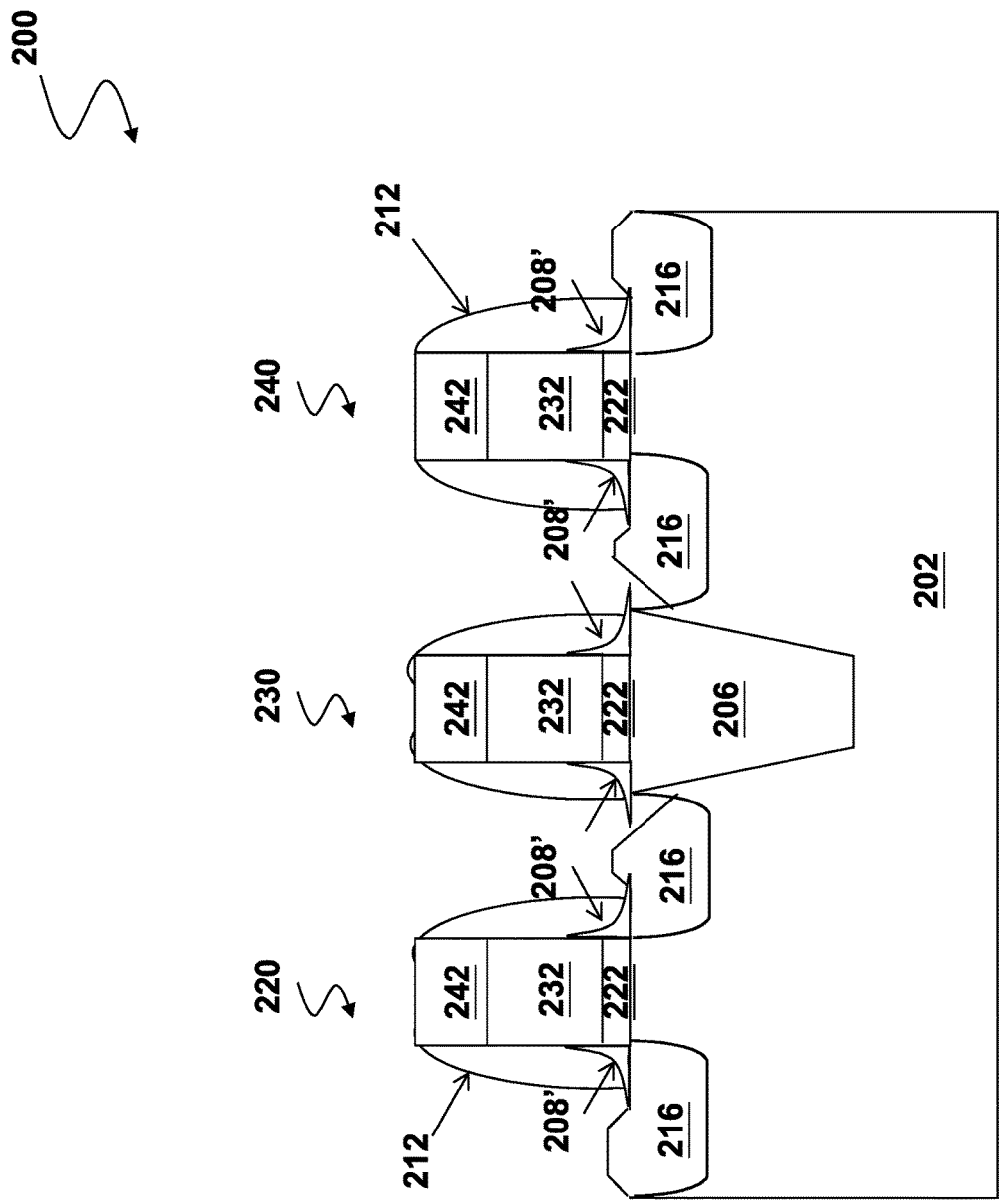

Referring to FIGS. 1 and 7, the method 100 continues with step 112 in which source/drain features 216 are formed in the recess cavities 214 of the substrate 202. In some embodiments, the source/drain features 216 includes a strained material grown in the recess cavities 214 using a process such as selective epitaxy growth (SEG), cyclic deposition and etching (CDE), chemical vapor deposition (CVD) techniques (e.g., vapor-phase epitaxy (VPE) and/or ultra-high vacuum CVD (UHV-CVD)), molecular beam epitaxy (MBE), other suitable epi processes, or combinations thereof. In some embodiments, the strained material has a lattice constant different from the substrate 202 to induce a strain or stress on the channel region of the semiconductor device 200, and therefore enable carrier mobility of the device to enhance the device performance.

In the present embodiment, an optional pre-cleaning process may be performed to clean the recess cavities 214 using, for example, a chemical comprising hydrofluoric acid (HF) or other suitable solution. Then, gaseous and/or liquid precursors may be provided to interact with the composition of the substrate 202 to form the strained material, such as silicon germanium (SiGe), to fill the recess cavities 214. In one embodiment, the process for forming a strained material such as SiGe is performed at a temperature of about 600° to 750° C. and under a pressure of about 10 Torr to about 80 Torr, using reaction gases comprising $SiH_2Cl_2$, HCl, $GeH_4$, $B_2H_6$, $H_2$, or combinations thereof. In some embodiments, a ratio of a mass flow rate of the $SiH_2Cl_2$ to a mass flow rate of the HCl is in the range of about 0.45 to 0.55.

In some embodiments, the growth of the strained material in the recess cavities 214 not adjacent to the isolation structure 206 is mainly parallel to the crystal plane of the top surface 202s of the substrate 202. In the present embodiment, the strained material in the recess cavities 214 not adjacent to the isolation structure 206 have an upper surface formed of the (100) crystal plane. In the present embodiment, the growth of the strained material in the recess cavities 214 adjacent to the isolation structure 206 is limited by the isolation structure 206 because the isolation structure 206 formed of silicon oxide fails to offer nucleation sites to grow an epitaxial material. In some embodiments, the growth of the strained material in the recess cavities 214 tends to have an upper surface not entirely parallel to the crystal plane of the top surface 202s of the substrate 202. In some embodiments, the growth of the strained material in the recess cavities 214 tends to have an upper surface formed of (111) crystal plane with a stable surface energy. The strained material in the recess cavities 214 adjacent to the isolation structure 206 occupies a small portion of the recess cavities 214 and, therefore, provides less strain as compared with the strained material in the recess cavities 214 closer to the gate stacks 220, 230, and 240. The spacer footings 208' formed by silicon nitride or SiCN adjoining the sidewalls of the gate stack 230 atop the isolation structure 206 can offer nucleation site for the growth of the strained material, and increase the portion of the strained material in the recess cavities 214.

Figure 8:
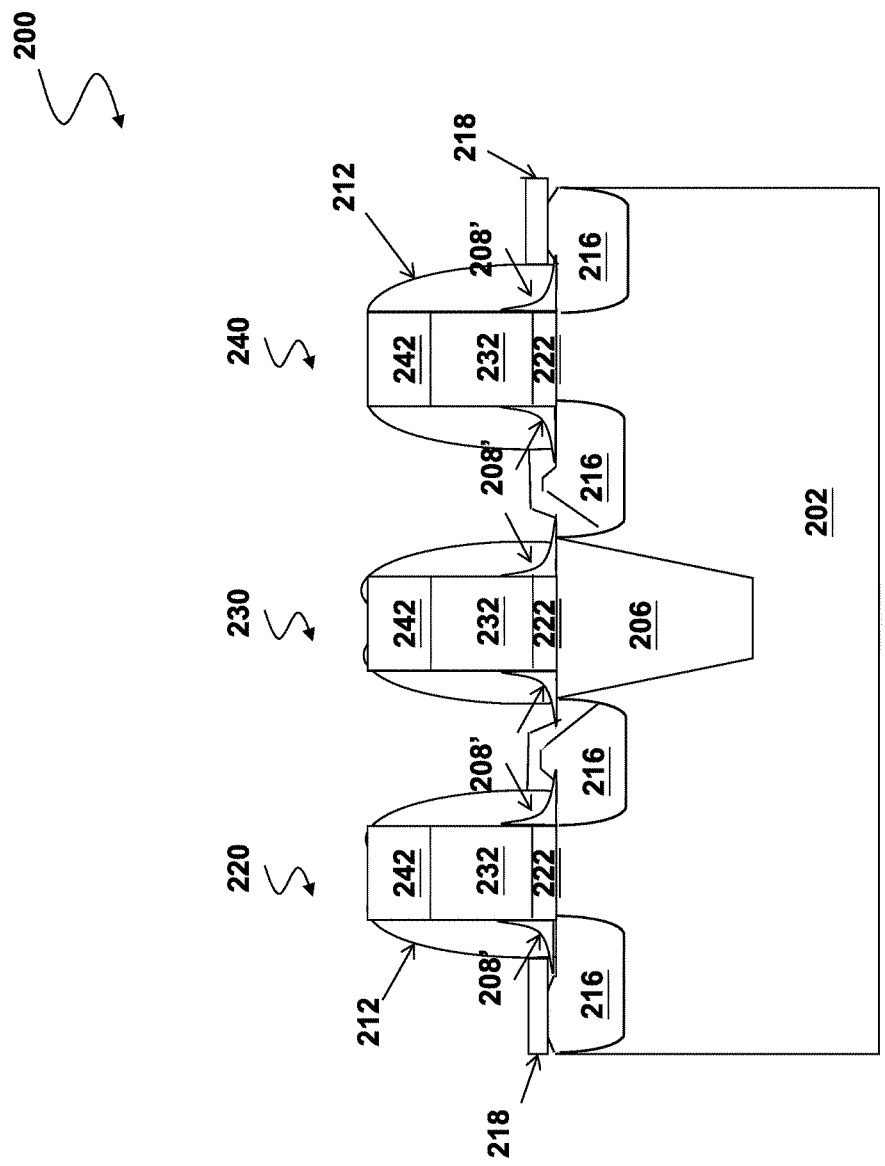

Referring to FIGS. 1 and 8, the method 100 continues with step 114 in which a capping layer 218 is formed over the source/drain features 216. The capping layer 218 may function as a protection layer to prevent the underlying strained material from being over-etched in a subsequent etching process. In the present embodiment, the capping layer 218 is formed by an epi growth process. In some embodiments, the capping layer 218 over the strained material in the recess cavities 214 may grow along the crystal orientation of the upper surface of the strained material. For example, the capping layer 218 over the strained material in the recess cavities 214 not adjacent to the isolation structure 206 has an upper surface formed of (100) crystal plane and the capping layer 218 over the strained material in the recess cavities 214 adjacent to the isolation structure 206 has an upper surface formed of (111) crystal plane. Since the spacer footings 208' extend beyond the edges 206e of the isolation structure 206 to prevent the isolation structure 206 loss resulted from chemicals attacking, the capping layer 218 over the strained material in the recess cavities 214 adjacent to the isolation structure 206 can have a relative planer surface to enhance the subsequent contact landing.

In some embodiments, the capping layer 218 comprises a material different from the strained material. In some embodiments, the capping layer 218 is a silicon-containing layer. In the present embodiment, the capping layer 218 is silicon. In some embodiments, the capping layer 218 is formed by a process including selective epitaxy growth (SEG), cyclic deposition and etching (CDE), chemical vapor deposition (CVD) techniques (e.g., vapor-phase epitaxy (VPE) and/or ultra-high vacuum CVD (UHV-CVD)), molecular beam epitaxy (MBE), other suitable epi processes, or combinations thereof. In the present embodiment, the capping layer 218 is formed by a process that is the same as the process for forming the strained material. In some embodiments, the capping layer 218 is continuously formed after forming the strained material by changing the process conditions to be performed at a temperature of about 700° C. to about 800° C., under a pressure of about 10 Torr to about 50 Torr, and using a silicon-containing gas (e.g., $SiH_2Cl_2$) as reaction gas. In an alternative embodiment, $B_2H_6$ and/or $H_2$ are introduced with the silicon-containing gas for forming the capping layer 218. It is understood that the semiconductor device 200 may undergo further CMOS processes to form various features such as contacts/vias, interconnect metal layers, dielectric layers, passivation layers, etc. In some embodiment, the gate stacks may be dummy gate stacks. Thus, the CMOS processes further comprise a "gate last" process to replace the polysilicon gate electrode with a metal gate electrode to improve device performance. In one embodiment, the metal gate electrode may include a metal such as Al, Cu, W, Ti, Ta, TiN, TiAl, TiAlN, TaN, NiSi, CoSi, other suitable conductive materials, or combinations thereof. It has been observed that the modified strained structure provides a given amount of strain into channel region of a semiconductor device, thereby enhancing the device performance.

The various embodiments of the present disclosure discussed above offer advantages over conventional methods, it being understood that no particular advantage is required for all embodiments, and that different embodiments may offer different advantages. One of the advantages is that the lower portion of the strained material in the S/D recess cavity adjacent to the isolation structure may be increased to enhance carrier mobility and upgrade the device performance. Another advantage is that the likelihood of device instability and/or device failure that results due to forming a subsequent silicide over the lower portion of the strained material may be prevented.

In one embodiment, a semiconductor device includes an isolation structure in a substrate, a gate stack atop the isolation structure, a first spacer adjoining a sidewall of the gate stack and extending beyond an edge of the isolation structure, and a second spacer over the first spacer.

In another embodiment, a semiconductor device includes an isolation structure in a substrate, a gate stack atop the isolation structure, and a spacer footing adjoining at least a portion of sidewall of the gate stack. The spacer footing includes a first side with a first height along the sidewall of the gate stack, a second side with a first width along a surface of the substrate, and an exterior surface connecting the first side and the second side. The first height is less than a height of the gate stack and the first width extends beyond an edge of the isolation structure.

In still another embodiment, a method for fabricating a semiconductor device includes forming an isolation feature in a substrate, forming a gate stack over a surface of the substrate, forming a first spacer material over the gate stack and the substrate, removing a portion of the first spacer material while leaving another portion of the first spacer material adjoining a lower portion of the gate stack, forming a second spacer material over the remaining first spacer material, the gate stack and, the substrate, removing a portion of the second spacer material while leaving another portion of the second spacer material adjoining an upper portion of the gate stack, forming a recess cavity in the substrate, forming an epitaxial (epi) material in the recess cavity, and forming a capping layer over the epitaxial (epi) material.

While the disclosure has described by way of example and in terms of the preferred embodiments, it is to be understood that the disclosure is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor device, comprising:
   an isolation structure in a substrate;
   a dummy gate stack atop the isolation structure, the dummy gate stack having a first sidewall and a second sidewall, the second sidewall being opposite the first sidewall, the dummy gate stack comprising:
      a gate dielectric layer contacting a top surface of the isolation structure, the gate dielectric layer extending from the first sidewall of the dummy gate stack to the second sidewall of the dummy gate stack;
      a gate electrode layer over the gate dielectric layer; and
      a hard mask layer over the gate electrode layer, top and bottom surfaces of each of the gate dielectric layer, the gate electrode layer and the hard mask layer being planar surfaces;
   a first spacer adjoining the first sidewall of the dummy gate stack and extending across a boundary of the isolation structure, the first spacer having a curved, concave, exterior surface;
   a second spacer adjoining the first sidewall of the dummy gate stack and over the first spacer, the second spacer contacting the gate electrode layer and the hard mask layer, the second spacer extending across an interface between the gate electrode layer and the hard mask layer, the first spacer having a height less than a height of the second spacer, the first spacer having a width greater than a maximum width of the second spacer, and the second spacer having a bottom surface below a top surface of the first spacer;
   a strained feature is in the substrate and adjacent to the first spacer; and
   a capping layer atop the strained feature, at least a portion of the capping layer extending over and contacting the top surface of the first spacer, at least a portion of the top surface of the first spacer being free from the capping layer and the second spacer.

2. The semiconductor device of claim 1, wherein the first spacer has a height ranging from about 3 nm to about 10 nm.

3. The semiconductor device of claim 1, wherein the first spacer has a width ranging from about 5 nm to about 10 nm.

4. The semiconductor device of claim 1, wherein the first spacer adjoins a lower portion of the first sidewall of the dummy gate stack and the second spacer adjoins an upper portion of the first sidewall of the dummy gate stack.

5. The semiconductor device of claim 1, wherein the first spacer comprises silicon nitride or SiCN.

6. The semiconductor device of claim 1, wherein the first spacer directly contacts the capping layer.

7. The semiconductor device of claim 1, further comprising an active gate stack on the substrate adjacent the dummy gate stack, the dummy gate stack having a same structure as the dummy gate stack.

8. The semiconductor device of claim 1, wherein the first spacer and the second spacer comprise different materials.

9. The semiconductor device of claim 1, wherein the capping layer and the strained feature comprise different materials.

10. A semiconductor device, comprising:
    an isolation structure in a substrate;
    a first source/drain feature in the substrate adjacent the isolation structure;
    a gate stack atop the isolation structure, wherein the gate stack comprises:
       a gate electrode layer; and
       a hard mask layer over the gate electrode layer;

a first spacer footing adjoining at least a portion of a first sidewall of the gate stack, the first spacer footing includes a first side with a first height along the first sidewall of the gate stack, a second side with a first width along a surface of the substrate, and an exterior surface connecting the first side and the second side, wherein the first height is less than a height of the gate stack and the second side being on the isolation structure and the first source/drain feature, and wherein a topmost surface of the first source/drain feature is above at least a first portion of a top surface of the first spacer footing;

a gate spacer adjoining another portion of the first sidewall of the gate stack, wherein the first width is greater than a width of the gate spacer, wherein the first height is less than a height of the gate spacer, wherein at least a portion of a bottom surface of the gate spacer is below at least a second portion of the top surface of the first spacer footing, wherein the gate spacer contacts the gate electrode layer and the hard mask layer, and wherein the gate spacer extends across an interface between the gate electrode layer and the hard mask layer; and a capping layer atop the first source/drain feature, at least a portion of the capping layer extending over and contacting the first portion of the top surface of the first spacer footing, wherein a third portion of the top surface of the first spacer footing is free from the capping layer and the gate spacer, and wherein the third portion of the top surface of the first spacer footing is interposed between the first portion of the top surface of the first spacer footing and the second portion of the top surface of the first spacer footing.

11. The semiconductor device of claim 10, wherein the exterior surface has a concave shape, the gate spacer directly adjoining the concave exterior surface of the first spacer footing.

12. The semiconductor device of claim 10, wherein the isolation structure is shallow trench isolation (STI).

13. The semiconductor device of claim 10, wherein the first height is less than a height of the gate spacer.

14. The semiconductor device of claim 10, wherein the first width is greater than about 5 nm.

15. The semiconductor device of claim 10, wherein the first spacer footing comprises a material different from the gate spacer.

16. The semiconductor device of claim 10 further comprising:

a second source/drain feature in the substrate adjacent the isolation structure, the isolation structure being between the first and second source/drain features; and a second spacer footing adjoining at least a portion of a second sidewall of the gate stack, the second sidewall being opposite the first sidewall, the second spacer footing having a second height along the second sidewall of the gate stack, wherein the second height is less than a height of the gate stack and the second spacer footing being on the isolation structure and the second source/drain feature.

17. The semiconductor device of claim 10, wherein the first source/drain feature comprises a strained material.

18. A method for fabricating a semiconductor device, comprising:

forming an isolation feature in a substrate;

forming one or more gate stacks over a surface of the substrate;

forming a first spacer material over the one or more gate stacks and the substrate;

removing a portion of the first spacer material while leaving another portion of the first spacer material adjoining a lower portion of sidewalls of respective ones of the one or more gate stacks, the removing forming a concave exterior surface on the remaining first spacer material;

forming a second spacer material over the remaining first spacer material, the one or more gate stacks, and the substrate;

removing a portion of the second spacer material while leaving another portion of the second spacer material adjoining an upper portion of the sidewalls of respective ones of the one or more gate stacks, the removing forming a convex exterior surface on the remaining second spacer material, the remaining first spacer material extending further from sidewalls of respective ones of the one or more gate stacks than the remaining second spacer material;

forming a recess cavity in the substrate adjacent the remaining first spacer material;

forming an epitaxial material in the recess cavity; and forming a capping layer over the epitaxial material, at least a portion of the concave exterior surface of the remaining first spacer material being exposed in a gap between the remaining second spacer material and the capping layer.

19. The method of claim 18, wherein the step of removing the portion of the first spacer material is performed by a dry etching process using $CF_4$, $CHF_3$, $SF_6$ or combinations thereof.

20. The method of claim 18, wherein at least one of the one or more gate stacks is formed over the isolation feature, and wherein the remaining first spacer material adjacent the at least one of the one or more gate stacks over the isolation feature extends past an edge of the isolation feature.

21. The method of claim 18, wherein at least one of the one or more gate stacks is formed over the isolation feature, and wherein the remaining first spacer material adjacent the at least one of the one or more gate stacks over the isolation feature is on the isolation feature and the epitaxial material in the recess cavity.

* * * * *